United States Patent [19]
Naito et al.

[11] Patent Number: 5,828,093
[45] Date of Patent: Oct. 27, 1998

[54] CERAMIC CAPACITOR AND SEMICONDUCTOR DEVICE IN WHICH THE CERAMIC CAPACITOR IS MOUNTED

[75] Inventors: Yasuyuki Naito; Yukio Sakabe, both of Kyoto, Japan

[73] Assignee: Murata Manufacturing Co., Ltd., Japan

[21] Appl. No.: 843,787

[22] Filed: Apr. 21, 1997

Related U.S. Application Data

[63] Continuation of Ser. No. 267,035, Jun. 27, 1994, abandoned.

[30] Foreign Application Priority Data

Jun. 29, 1993 [JP] Japan ........................... 5-159179

[51] Int. Cl.$^6$ ................ H01L 29/76; H01L 29/00; H01L 23/053; H01L 29/94
[52] U.S. Cl. .................. 257/295; 257/535; 257/700; 257/703; 361/321.3; 501/136
[58] Field of Search .................... 257/532, 534, 257/535, 924, 916, 700, 703, 684, 295; 361/321.3–0.5; 174/258; 501/136

[56] References Cited

U.S. PATENT DOCUMENTS

| | | | |
|---|---|---|---|
| 3,638,147 | 1/1972 | Denes | 333/79 |
| 4,109,292 | 8/1978 | Shibayama et al. | 361/321 |
| 4,591,947 | 5/1986 | Bagley et al. | 361/310 |
| 4,747,014 | 5/1988 | Kaino et al. | 361/321 |
| 4,827,328 | 5/1989 | Ozawa et al. | 257/531 |
| 5,049,979 | 9/1991 | Hashemi et al. | 257/684 |
| 5,067,006 | 11/1991 | Shiga | 257/684 |
| 5,416,356 | 5/1995 | Staudinger et al. | 257/531 |

OTHER PUBLICATIONS

Hashemi et al., "The Close Attached Capacitor: A Solution to Switching Noise Proble MS", IEEE Log No. 9203458, Mar. 16, 1992.

*Primary Examiner*—Teresa M. Arroyo
*Attorney, Agent, or Firm*—Ostrolenk, Faber, Gerb & Soffen, LLP

[57] ABSTRACT

In a capacitor, one capacitor electrode is formed on first principal face of a ceramic dielectric substrate. An area of a first capacitor electrode is smaller than an area of the first principal face. A second capacitor electrode is formed on a second principal face of the ceramic dielectric substrate, and connected to a lead electrode which is formed at the periphery of the first principal face of the ceramic dielectric substrate so as to be separated from the one capacitor electrode by a gap and to surround the first capacitor electrode. The ceramic capacitor is mounted on a semiconductor element through an insulating layer. The capacitor electrodes and lead electrode of the ceramic capacitor are connected to terminals of the semiconductor element by a wire bonding.

36 Claims, 3 Drawing Sheets

CERAMIC CAPACITOR AND SEMICONDUCTOR DEVICE IN WHICH THE CERAMIC CAPACITOR IS MOUNTED

This is a Continuation of application Ser. No. 08/267,035 filed on Jun. 27, 1994, abandoned.

BACKGROUND OF THE INVENTION

1. Field of the Invention

The invention relates to a ceramic capacitor which can be used as a bypass capacitor for a semiconductor element such as an IC, an LSI or the like, and also to a semiconductor device in which the ceramic capacitor is mounted.

2. Discussion of the Related Art

Recent tendencies to miniaturize, accelerate and digitize electronic equipment keep on expanding. With such tendencies, demands for the miniaturization and high-density mounting of electronic parts which are to be used in such electronic equipment are still increased. Conventionally, a bypass capacitor for a semiconductor element such as an IC, or an LSI which constitutes the foundation of the miniaturization, acceleration and digitization of electronic equipment is mounted at the periphery of the semiconductor element disposed on a circuit board. In order to reduce the occupying area of a bypass capacitor on a circuit board, consequently, techniques of reducing the size of the capacitor have been developed. Such techniques include those of forming a bypass capacitor into a laminated structure, or as a chip. As a result, a laminated ceramic capacitor formed into a chip is mainly used for the above-mentioned purposes.

In the conventional mounting technique in which a bypass capacitor is mounted at the periphery of a semiconductor element such as an IC or an LSI disposed on the circuit board, however, a space for mounting the bypass capacitor and forming wirings for the capacitor is required at the periphery of the semiconductor element such as an IC or an LSI even when the miniaturization of the bypass capacitor is advanced to a large degree. Consequently, a circuit board has a limit in miniaturization.

Furthermore, an inductance component which is generated in wirings elongating between the semiconductor element such as an IC or an LSI and the bypass capacitor has a value which is so large that it cannot be neglected. In a circuit which operates at a high speed, therefore, there arises a problem in that it is impossible to sufficiently eliminate noise.

SUMMARY OF THE INVENTION

Accordingly, it is an object of the invention to provide a bypass capacitor for a semiconductor element such as an IC, an LSI or the like which does not require a mounting space and a wiring space on a circuit board, and which can reduce the inductance due to the capacitor body itself and due to wirings, so that it performs a function of sufficiently eliminating noise even when it is used in a high-speed digital circuit.

It is another object of the invention to provide a semiconductor device in which the above-mentioned ceramic capacitor is mounted.

According to a first aspect of the invention, there is provided a ceramic capacitor which is characterized in that one capacitor electrode is formed on one principal face of a ceramic dielectric substrate, said one capacitor electrode having an area which is smaller than an area of said one principal face, the other capacitor electrode is formed on the other principal face of said ceramic dielectric substrate, and said other capacitor electrode is connected to a lead electrode which is formed at a periphery of said one principal face of said ceramic dielectric substrate so as to be separated from said one capacitor electrode by a gap and to surround said one capacitor electrode.

A substrate for an $SrTiO_3$ boundary layer type semiconductive capacitor may be used as the ceramic dielectric substrate, thereby enabling the ceramic capacitor to have a large capacity and excellent frequency characteristics.

In order to improve the wire bonding properties, outer electrodes which are mainly made of at least one of Au, Pt, and Pd are preferably formed on at least one part of surfaces of said capacitor electrode and said lead electrode which are formed on said one principal face of said ceramic substrate.

Further, according to the invention, there is provided a semiconductor device which is characterized in that the ceramic capacitor of the first aspect of the invention is mounted on a semiconductor element through an insulating layer, and said capacitor electrodes and said lead electrode of said ceramic capacitor are connected to terminals of said semiconductor element by the wire bonding.

The ceramic capacitor of the invention can be mounted in the following manner: The capacitor is placed on the upper face of a semiconductor element such as an IC, or an LSI while the face on which the one capacitor electrode and the lead electrode are formed is directed upward, and then fixed to the upper face. Thereafter, the one capacitor electrode and the lead electrode are connected to terminals of the semiconductor element by the wire bonding. In the process of mounting of the capacitor, therefore, a mounting space, and a wiring space which are dedicated to the capacitor are not required.

Moreover, the ceramic capacitor of the invention has a configuration in which opposing electrodes are formed on a flat ceramic dielectric. Therefore, the internal inductance of the capacitor is substantially negligible. A connection between the capacitor and a semiconductor element such as an IC, or an LSI can be done by connecting terminals of the semiconductor element to the electrodes of the present capacitor by the wire bonding, whereby the increase of the inductance component due to the wirings can be suppressed to a minimum level.

The above and other objects and features of the present invention will be more apparent from the following description taken in conjunction with the accompanying drawings.

DETAILED DESCRIPTION OF THE PREFERRED EMBODIMENTS

Hereinafter, embodiments of a ceramic capacitor according to the invention will be described with reference to the accompanying drawings.

Figure 1:
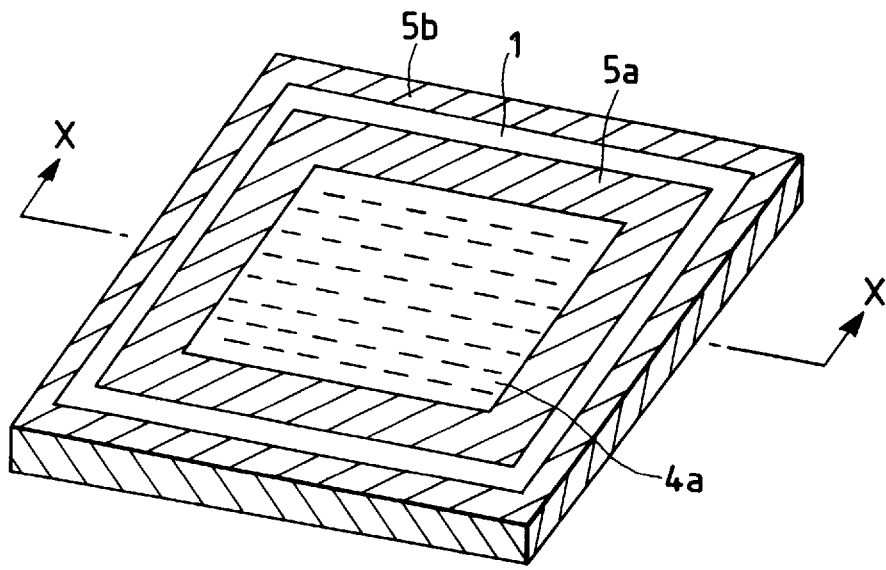
FIG. 1 is a perspective view showing a ceramic capacitor according to a first embodiment of the invention.
Figure 2:
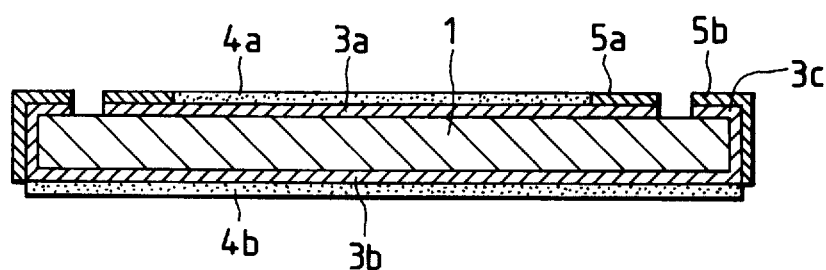
FIG. 2 is a cross-sectional view taken along a line X—X of FIG. 1.
Figure 3:
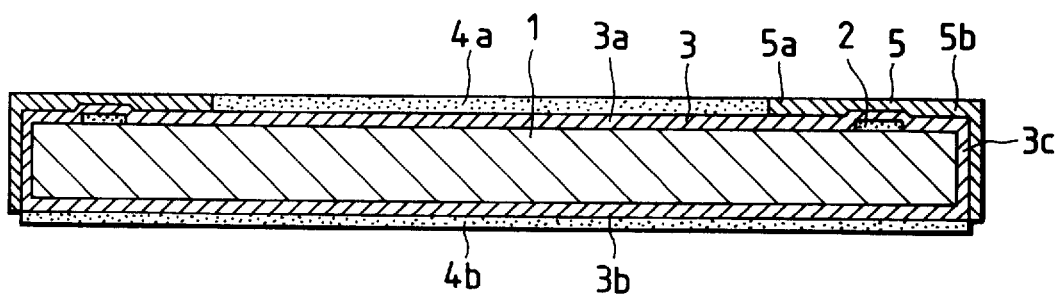
FIG. 3 is a cross-sectional view showing a production step of the ceramic capacitor according to the invention.

FIG. 1 is a perspective view showing a first embodiment, FIG. 2 is a cross-sectional view taken along a line X—X of FIG. 1, and FIG. 3 is a cross-sectional view showing a production step of the capacitor.

In FIG. 1, reference numeral 1 designates a ceramic dielectric substrate for an $SrTiO_3$ boundary layer type semiconductive capacitor; 4a, a masking layer which has a resistance to solvent and exhibits an electrically insulating property; and 5a and 5b, first and second outer electrodes which are made of Au, respectively.

In FIG. 2, reference numeral 3a designates a first capacitor electrode which is made of Cu and formed on one principal face of the ceramic dielectric substrate 1, and 3b designates a second capacitor electrode which is made of Cu and formed on the other principal face of the ceramic dielectric substrate 1. Reference numeral 3c designates a lead electrode which is made of Cu and formed at the periphery of the ceramic dielectric substrate 1 so as to surround the first capacitor electrode 3a. The lead electrode 3c is connected to the second capacitor electrode 3b. Reference numeral 4b designates a masking layer which has a resistance to solvent and exhibits an electrically insulating property in the same manner as the masking layer 4a. The other portions shown in FIG. 2 are the same as those of FIG. 1. Therefore, they are designated by the same reference numerals, and their description is omitted.

Next, a method of producing the ceramic capacitor of the invention will be described with reference to FIG. 3.

First, the ceramic dielectric substrate 1 for an $SrTiO_3$ boundary layer type semiconductive capacitor was prepared so as to be 10-mm square and have a thickness of 0.4 mm, by a known method. Pitch type resist ink which is soluble in an organic solvent and insoluble in a plating solution was printed on the one principal face of the ceramic dielectric substrate 1, and then dried so that a resist layer 2 which has a □-shape in a plan view was formed. Thereafter, the ceramic dielectric substrate 1 was subjected to pretreatment processes of the addition of sensitivity and the activation, and then to an electroless Cu plating process, whereby an inner electrode 3 made of Cu was formed on the whole face of the ceramic dielectric substrate 1. Then, masking paste which exhibits an electrically insulating property after it is dried and is insoluble in an organic solvent was printed on the both faces of the ceramic dielectric substrate 1 on which the inner electrode 3 was formed, and then dried so that the masking layer 4a was formed on the center portion of the one principal face on which the resist layer 2 was previously formed, and the masking layer 4b was formed on the whole of the other principal face. Thereafter, an outer electrode 5 made of Au was formed by a conventional electroless Au plating method on an exposed portion of the inner electrode 3. Finally, the ceramic dielectric substrate 1 which had been processed as described above was immersed in an organic solvent so that the resist layer 2 was dissolved, whereby the inner electrode 3 was divided into the capacitor electrode 3a and the capacitor electrode 3b having the lead electrode 3c, and the outer electrode 5 was divided into the outer electrodes 5a and 5b, so that the opposing electrodes are formed. As a result, the ceramic capacitor shown in FIGS. 1 and 2 was obtained.

Figure 4:
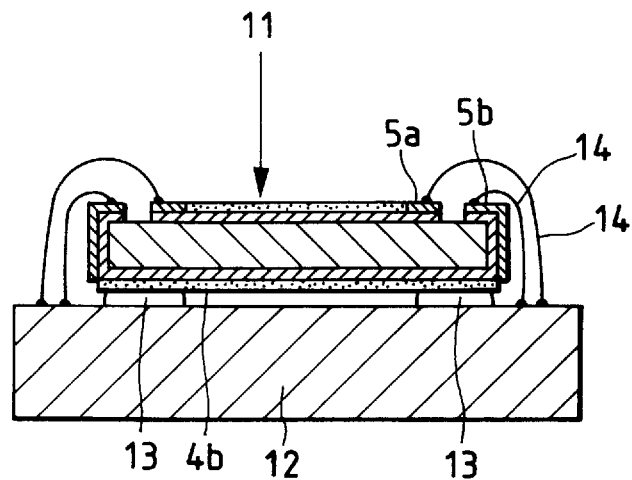
FIG. 4 is a cross-sectional view showing a semiconductor device in which the ceramic capacitor of the invention is mounted.

FIG. 4 shows an example of a method of mounting the thus obtained ceramic capacitor. The ceramic capacitor 11 of the invention was placed on a semiconductor element 12 through an insulating layer consisting of the masking layer 4b, and then fixed to the semiconductor element by an adhesive 13. Thereafter, the outer electrodes 5a and 5b of the ceramic capacitor 11 which are made of Au were connected to terminals (not shown) of the semiconductor element 12 via gold wires 14 by the wire bonding.

As a result of the employment of the mounting method, a space for mounting the ceramic capacitor on a circuit board and conducting the wiring is unnecessary, and it was observed that the effect of sufficiently eliminating noise was attained.

The noise elimination characteristics were checked while changing the electrostatic capacity of the ceramic capacitor. As compared with the case where a ceramic capacitor was mounted on a circuit board and at the periphery of a semiconductor element in the same manner as the prior art, the ceramic capacitor of the embodiment attained the same noise eliminating effect at an electrostatic capacity which is smaller by about 20%. The reason for this phenomenon can be described as follows: Since the ceramic capacitor 11 having a simple structure was mounted on the semiconductor element 12 and the two components were connected by the wire bonding, the wirings were shortened, and therefore the increase of the inductance due to the mounting of the ceramic capacitor 11 was suppressed.

In the embodiment, the material of the ceramic dielectric substrate was ceramics for an $SrTiO_3$ boundary layer type semiconductive capacitor. The material of the substrate is not restricted to this, and other various materials such as $BaTiO_3$ ceramics may be used.

In the embodiment, the material of the capacitor electrodes was Cu, and that of the outer electrodes was Au. The materials of the electrodes are not restricted to them. As the material of the capacitor electrodes, various materials may suitably be used. For example, in addition to Cu, other materials such as Ag, Pd, and Ni which are known as materials of electrodes of a ceramic capacitor may be used singly or combinedly. Alternatively, a multilayer electrode of Ag-Ni, Cu-Ni, or the like may be used. As the material of the outer electrodes, in addition to Au, other materials such as Pt, and Pd which exhibit good wire-bonding characteristics may be used in a similar manner.

The masking layers which exhibit an electrically insulating property are not essential. From the view point of performance, the masking layers are not particularly necessary provided that the face of a semiconductor element such as an IC or an LSI on which the ceramic capacitor of the invention is placed has been subjected to an insulation process before the mounting process.

The method of producing the ceramic capacitor of the invention is not restricted to or by the above-described embodiment. For example, before the formation of the outer electrodes made of Au, the resist layer may be dissolved by a solvent to be removed away. Alternatively, an electrode may be formed directly on the whole face without using resist ink, and a part of the electrode may be then dissolved by acid etching to be removed away so that the electrode is divided into the opposing electrodes for forming the capacitor. The method of forming the electrodes is not restricted to an electroless plating process. The electrodes may be formed by a thin film formation method such as vapor deposition, or a thick film formation method such as screen printing.

The shapes of the capacitor, and the electrodes are not restricted to those of the embodiment. Hereinafter, other embodiments will be described.

Figure 5:
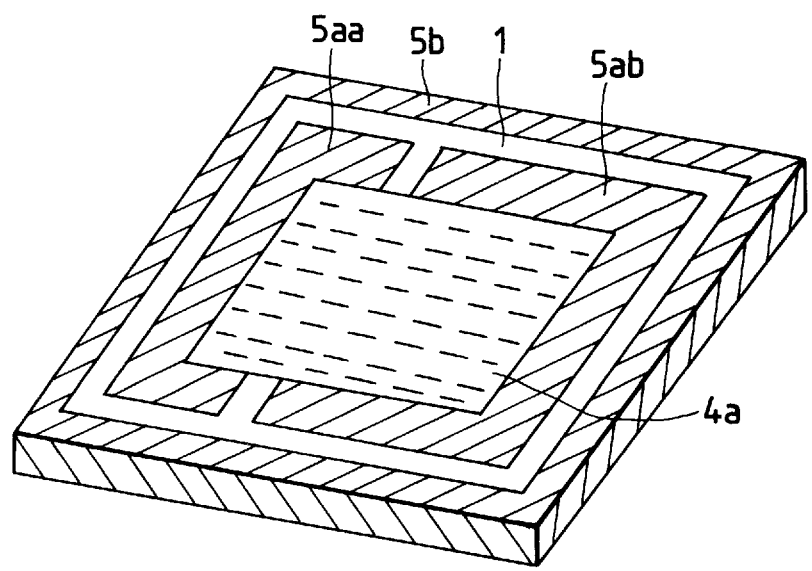
FIG. 5 is a perspective view showing a ceramic capacitor according to a second embodiment of the invention.

FIG. 5 shows a second embodiment in which the outer electrode formed on the center portion of the one principal face of the ceramic dielectric substrate 1 is divided into two outer electrodes 5aa and 5ab so that two different electrostatic capacities are obtained in the same ceramic capacitor. The other portions are the same as those of FIGS. 1 and 2 showing the first embodiment. Therefore, they are designated by the same reference numerals, and their description is omitted.

Figure 6:
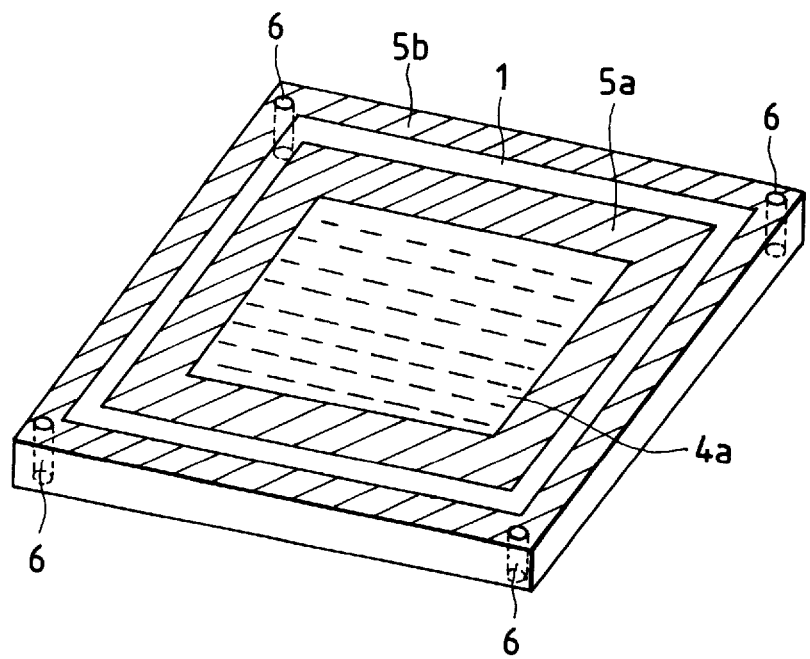
FIG. 6 is a perspective view showing a ceramic capacitor according to a third embodiment of the invention.

FIG. 6 shows a third embodiment. In the third embodiment, the lead electrode formed at the periphery of the one principal face of the ceramic dielectric substrate 1 is connected to the capacitor electrode formed on the other principal face via through holes 6 instead of the end faces of the ceramic dielectric substrate 1. The other portions are the same as those of FIGS. 1 and 2 showing the first embodiment. Therefore, they are designated by the same reference numerals, and their description is omitted.

Figure 7:
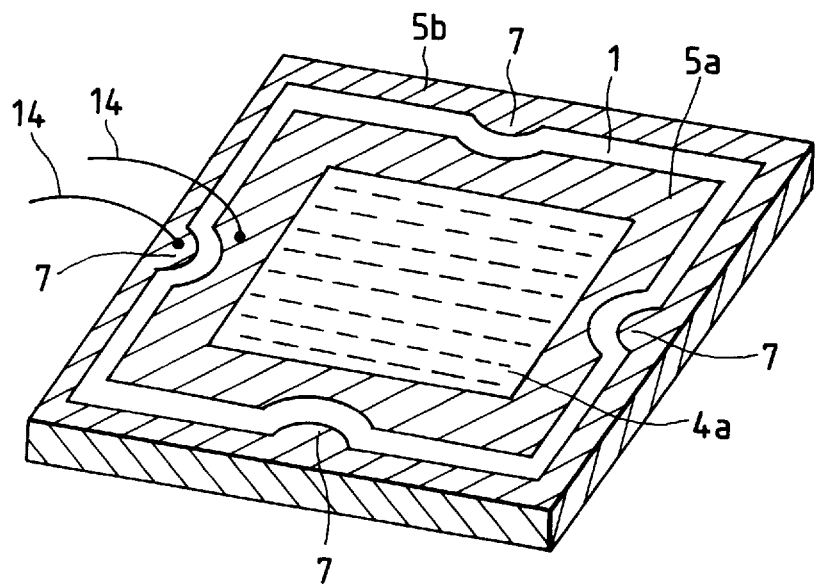
FIG. 7 is a perspective view showing a ceramic capacitor according to a fourth embodiment of the invention.

FIG. 7 shows a fourth embodiment in which the outer electrode 5b formed at the periphery of the one principal face of the ceramic dielectric substrate 1 has bulges 7 to increase the area of the electrode so that the wire bonding using the gold wires 14 is easily conducted. The other portions shown in FIG. 7 are the same as those of FIGS. 1 and 2 showing the first embodiment. Therefore, they are designated by the same reference numerals, and their description is omitted.

As apparent from the above description, the ceramic capacitor of the invention can be mounted on the upper face of a semiconductor element such as an IC, or an LSI. Therefore, a mounting space, and a wiring space which are dedicated to the capacitor in a process of mounting the capacitor are not required, thereby enabling a high-density mounting to be realized.

Moreover, the ceramic capacitor of the invention has a simple configuration in which opposing electrodes are formed on a flat dielectric. Therefore, the internal inductance of the capacitor is substantially negligible. Moreover, a connection between the capacitor and a semiconductor element such as an IC, or an LSI can be done by connecting terminals of the semiconductor element to the electrodes by the wire bonding, whereby the increase of the inductance due to the wirings can be suppressed to a minimum level. Therefore, an effect of sufficiently eliminating noise can be attained even when the capacitor is used in a high-speed digital circuit.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A ceramic capacitor comprising:
   a ceramic dielectric substrate having substantially planar first and second principal faces which are opposed to each other through said ceramic dielectric substrate, and side faces which extend between said first and second principal faces;
   a first capacitor electrode formed on said first principal face of said ceramic dielectric substrate, said first capacitor electrode having an area which is smaller than that of said first principal face;
   a second capacitor electrode formed on said second principal face of said ceramic dielectric substrate; and
   a lead electrode formed at a periphery of said first principal face and extending along a side face to said second principal face of said ceramic dielectric substrate, and being connected at said second principal face to said second capacitor electrode, said lead electrode being separated from said first capacitor electrode by a gap and surrounding said first capacitor electrode.

2. A ceramic capacitor according to claim 1, wherein said ceramic dielectric substrate comprises a substrate for an $SrTiO_3$ boundary layer type semiconductive capacitor.

3. A ceramic capacitor according to claim 1, further comprising outer electrodes which are mainly made of at least one material selected from the group consisting of Au, Pt and Pd and formed on at least one part of surfaces of said first capacitor electrode and said lead electrode which are formed on said first principal face of said ceramic substrate.

4. A ceramic capacitor according to claim 2, further comprising outer electrodes which are mainly made of at least one material selected from the group consisting of Au, Pt and Pd and formed on at least one part of surfaces of said first capacitor electrode and said lead electrode which are formed on said first principal face of said ceramic substrate.

5. A semiconductor device wherein a ceramic capacitor of claim 1 is mounted on a semiconductor element through an insulating layer, and said capacitor electrodes and said lead electrode of said ceramic capacitor are connected to terminals of said semiconductor element by wire bonding.

6. A ceramic capacitor according to claim 1, wherein said first capacitor electrode formed on said first principal face of said ceramic substrate is divided into two parts.

7. A ceramic capacitor comprising:
   a ceramic dielectric substrate having substantially planar first and second principal faces which are opposed to each other through said ceramic dielectric substrate;
   a first capacitor electrode formed on said first principal face of said ceramic dielectric substrate, said first capacitor electrode having an area which is smaller than that of said first principal face;
   a second capacitor electrode formed on said second principal face of said ceramic dielectric substrate; and
   a lead electrode formed at a periphery of said first principal face of said ceramic dielectric substrate and connected to said second capacitor electrode, said lead electrode being separated from said first capacitor electrode by a gap and surrounding said first capacitor electrode,
   wherein said lead electrode formed at the periphery of said first principal face of said ceramic dielectric substrate has bulges to increase the area of the electrode.

8. A ceramic capacitor according to claim 1, further comprising first and second insulating layers respectively on said first and second capacitor electrodes.

9. A ceramic capacitor according to claim 6, wherein said two parts are a pair of electrodes on said first principal face.

10. A ceramic capacitor according to claim 7, wherein said first capacitor electrode has respective recesses corresponding to said bulges in said lead electrode.

11. A ceramic capacitor according to claim 1, further comprising an insulating layer formed on at least one of said first and second capacitor electrodes.

12. A ceramic capacitor according to claim 5, wherein said insulating layer is formed on said second principal face of said substrate.

13. A ceramic capacitor according to claim 5, wherein said ceramic dielectric substrate comprises a substrate for an $SrTiO_3$ boundary layer type semiconductive capacitor.

14. A ceramic capacitor according to claim 5, wherein said first capacitor electrode formed on said first principal face of said ceramic substrate is divided into two parts.

15. A ceramic capacitor according to claim 14, wherein said two parts are a pair of electrodes on said first principal face.

16. A semiconductor device comprising a ceramic capacitor mounted on a semiconductor element through an insulating layer, said ceramic capacitor comprising:

a ceramic dielectric substrate having substantially planar first and second principal faces which are opposed to each other through said ceramic dielectric substrate;

a first capacitor electrode formed on said first principal face of said ceramic dielectric substrate, said first capacitor electrode having an area which is smaller than that of said first principal face;

a second capacitor electrode formed on said second principal face of said ceramic dielectric substrate; and a lead electrode formed at a periphery of said first principal face of said ceramic dielectric substrate and connected to said second capacitor electrode, said lead electrode being separated from said first capacitor electrode by a gap and surrounding said first capacitor electrode, wherein said lead electrode formed at the periphery of said first principal face of said ceramic dielectric substrate has bulges to increase the area of the electrode, and wherein said capacitor electrodes and said lead electrode of said ceramic capacitor are connected to terminals of said semiconductor element by wire bonding.

17. A ceramic capacitor according to claim 16, wherein said first capacitor electrode has respective recesses corresponding to said bulges in said second outer electrode.

18. A ceramic capacitor according to claim 12, further comprising another insulating layer formed on said first principal face of said substrate.

19. A ceramic capacitor comprising:

a ceramic dielectric substrate having substantially planar first and second principal faces which are opposed to each other through said ceramic dielectric substrate, and side faces which extend between said first and second principal faces;

a first capacitor electrode formed on said first principal face of said ceramic dielectric substrate, said first capacitor electrode having an area which is smaller than that of said first principal face;

a second capacitor electrode formed on said second principal face of said ceramic dielectric substrate; and a lead electrode formed at a periphery of said first principal face and extending along a side face to said second principal face of said ceramic dielectric substrate, and being connected at said second principal face to said second capacitor electrode, said lead electrode being separated from said first capacitor electrode by a gap and surrounding said first capacitor electrode; and first and second insulating layers disposed respectively on said first and second capacitor electrodes.

20. A ceramic capacitor according to claim 19, wherein said ceramic dielectric substrate comprises a substrate for an SrTiO$_3$ boundary layer type semiconductive capacitor.

21. A ceramic capacitor according to claim 20, further comprising outer electrodes which are mainly made of at least one material selected from the group consisting of Au, Pt and Pd and formed on at least one part of surfaces of said first capacitor electrode and said lead electrode which are formed on said first principal face of said ceramic substrate.

22. A ceramic capacitor according to claim 19, further comprising outer electrodes which are mainly made of at least one material selected from the group consisting of Au, Pt and Pd and formed on at least one part of surfaces of said first capacitor electrode and said lead electrode which are formed on said first principal face of said ceramic substrate.

23. A semiconductor device wherein a ceramic capacitor of claim 19 is mounted on a semiconductor element through an insulating layer, and said capacitor electrodes and said lead electrode of said ceramic capacitor are connected to terminals of said semiconductor element by wire bonding.

24. A ceramic capacitor according to claim 23, wherein said insulating layer is formed on said second principal face of said substrate.

25. A ceramic capacitor according to claim 24, further comprising another insulating layer formed on said first principal face of said substrate.

26. A ceramic capacitor according to claim 23, wherein said ceramic dielectric substrate comprises a substrate for an SrTiO$_3$ boundary layer type semiconductive capacitor.

27. A ceramic capacitor according to claim 23, wherein said first capacitor electrode formed on said first principal face of said ceramic substrate is divided into two parts.

28. A ceramic capacitor according to claim 27, wherein said two parts are a pair of electrodes on said first principal face.

29. A ceramic capacitor according to claim 19, wherein said first capacitor electrode formed on said first principal face of said ceramic substrate is divided into two parts.

30. A ceramic capacitor according to claim 29, wherein said two parts are a pair of electrodes on said first principal face.

31. A ceramic capacitor according to claim 19, wherein said lead electrode formed at the periphery of said first principal face of said ceramic dielectric substrate has bulges to increase the area of the electrode.

32. A ceramic capacitor according to claim 31, wherein said first capacitor electrode has respective recesses corresponding to said bulges in said lead electrode.

33. A ceramic capacitor according to claim 19, wherein:

said first insulating layer has an area which is smaller than that of said first capacitor electrode and thereby covers only a part of said first capacitor electrode; and another part of said first capacitor electrode is covered by a first outer electrode.

34. A ceramic capacitor according to claim 33, wherein said first insulating layer and said first outer electrode together cover substantially all of said first capacitor electrode.

35. A ceramic capacitor according to claim 33, wherein said lead electrode is covered by a second outer electrode both at said first principal face and at said side face.

36. A ceramic capacitor according to claim 19, wherein said lead electrode is covered by an outer electrode both at said first principal face and at said side face.

* * * * *